US012633494B2

(12) United States Patent (10) Patent No.: US 12,633,494 B2
Takahashi et al. (45) Date of Patent: May 19, 2026

(54) STAGE DEVICE, CHARGED PARTICLE BEAM DEVICE, AND VACUUM DEVICE

(71) Applicant: Hitachi High-Tech Corporation, Tokyo (JP)

(72) Inventors: Motohiro Takahashi, Tokyo (JP); Masaki Mizuochi, Tokyo (JP); Shuichi Nakagawa, Tokyo (JP); Raifu Yamamoto, Tokyo (JP); Tomotaka Shibazaki, Tokyo (JP); Keiichiro Hosobuchi, Tokyo (JP); Akira Nishioka, Tokyo (JP); Hironori Ogawa, Tokyo (JP); Takanori Kato, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 359 days.

(21) Appl. No.: 18/565,602

(22) PCT Filed: Jun. 15, 2021

(86) PCT No.: PCT/JP2021/022742
§ 371 (c)(1),
(2) Date: Nov. 30, 2023

(87) PCT Pub. No.: WO2022/264287
PCT Pub. Date: Dec. 22, 2022

(65) Prior Publication Data
US 2024/0258063 A1 Aug. 1, 2024

(51) Int. Cl.
*H01J 37/20* (2006.01)
*H01J 37/28* (2006.01)

(52) U.S. Cl.
CPC ............... *H01J 37/20* (2013.01); *H01J 37/28* (2013.01); *H01J 2237/002* (2013.01); *H01J 2237/20235* (2013.01); *H01J 2237/20278* (2013.01)

(58) Field of Classification Search
CPC ...... H01J 37/20; H01J 37/28; H01J 2237/002; H01J 2237/20235; H01J 2237/20278; H10P 72/50; H10P 76/00
(Continued)

(56) References Cited

U.S. PATENT DOCUMENTS

2009/0316133 A1    12/2009   Shibazaki
2012/0319505 A1*   12/2012   Motomura .......... G03F 7/70691
                                                      310/12.05
(Continued)

FOREIGN PATENT DOCUMENTS

CN    112928886 A    6/2021
EP    4 007 136 A1   6/2022
(Continued)

OTHER PUBLICATIONS

International Search Report (PCT/ISA/210) issued in PCT Application No. PCT/JP2021/022742 dated Sep. 14, 2021 with English translation (4 pages).
(Continued)

*Primary Examiner* — Michael Maskell
(74) *Attorney, Agent, or Firm* — Crowell & Moring LLP

(57) ABSTRACT

Provided is a stage device comprising a stage, a Z-axis motor that magnetically floats the stage, and an X-axis motor that drives, in one axial direction within a plane, the stage floated by the Z-axis motor, wherein: the X-axis motor is provided with an X-axis coil, a pair of X-axis magnets that face each other and that sandwich the X-axis coil in the vertical direction without contacting the X-axis coil, and an
(Continued)

100

X-axis yoke that holds the pair of X-axis magnets; the Z-axis motor is provided with a Z-axis coil, a Z-axis magnet, and a Z-axis yoke that holds the Z-axis magnet; and the Z-axis motor is disposed at a position that is below the X-axis motor such that the magnetic field which has leaked from the Z-axis motor is blocked by the X-axis yoke. Thus, it is possible to suppress magnetic field leakage and to perform high-speed positioning.

13 Claims, 6 Drawing Sheets

(58) Field of Classification Search
      USPC ........................................ 250/440.11, 442.11
      See application file for complete search history.

(56)                    References Cited

U.S. PATENT DOCUMENTS

| | | |
|---|---|---|
| 2020/0244192 A1 | 7/2020 | Ehmann et al. |
| 2021/0175787 A1 | 6/2021 | Yamamoto |

FOREIGN PATENT DOCUMENTS

| | | |
|---|---|---|
| JP | 11-186156 | 7/1999 |
| JP | 2017-11008 A | 1/2017 |
| JP | 2020-186815 A | 11/2020 |
| JP | 2021-22582 A | 2/2021 |
| TW | 200947143 A | 11/2009 |
| WO | WO 2011/108170 A1 | 9/2011 |

OTHER PUBLICATIONS

Japanese-language Written Opinion (PCT/ISA/237) issued in PCT Application No. PCT/JP2021/022742 dated Sep. 14, 2021 with English translation (5 pages).
Chinese-language Office Action issued in Taiwanese Application No. 111120551 dated Feb. 13, 2023 with partial English translation (4 pages).

* cited by examiner

[FIG. 1]
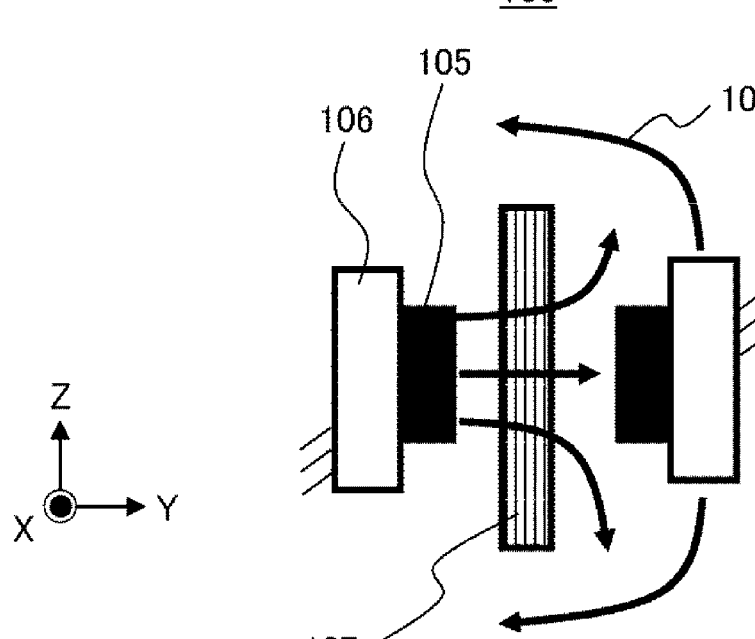
[FIG. 2]
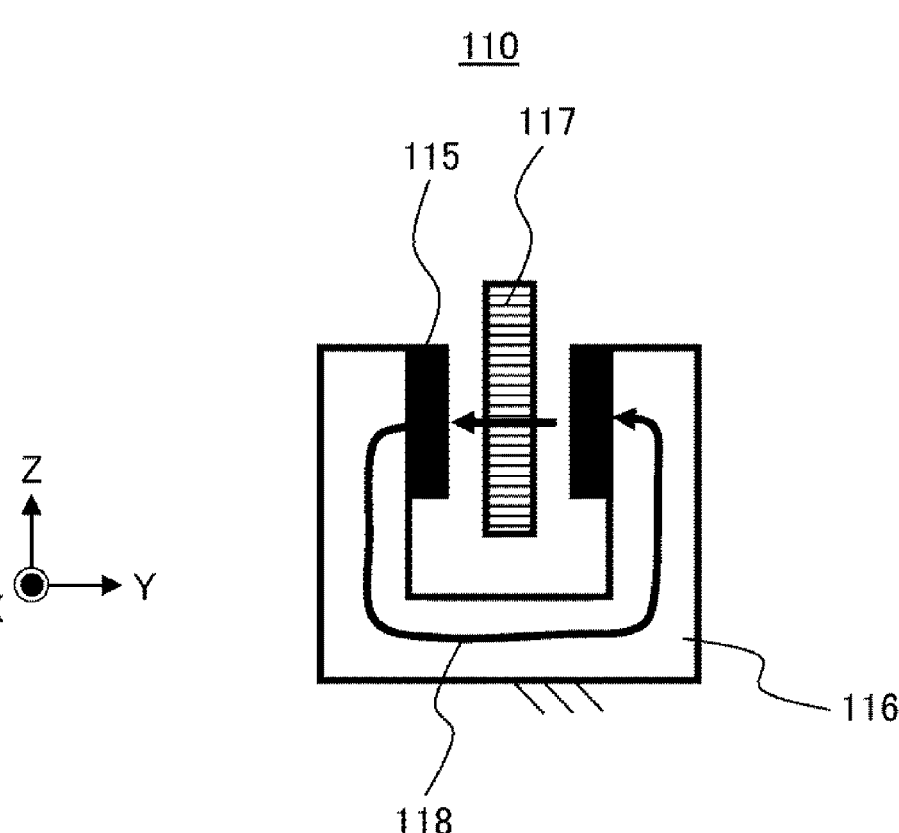

[FIG. 3]
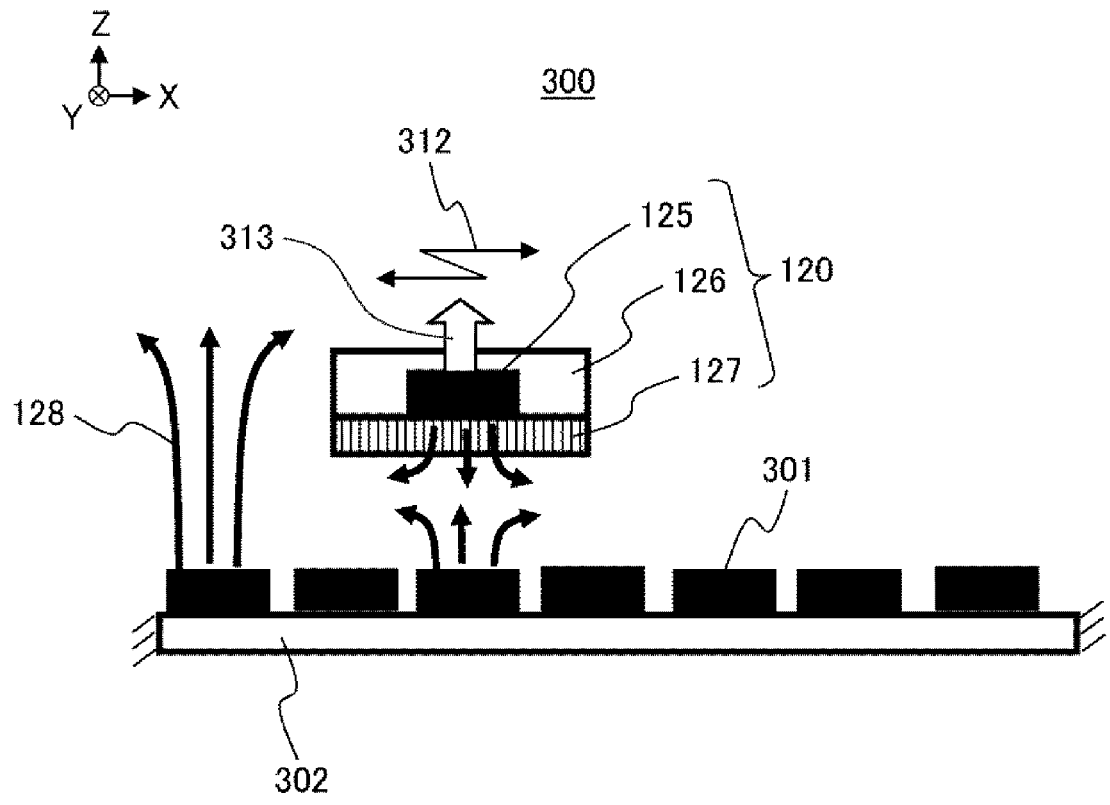
[FIG. 4]
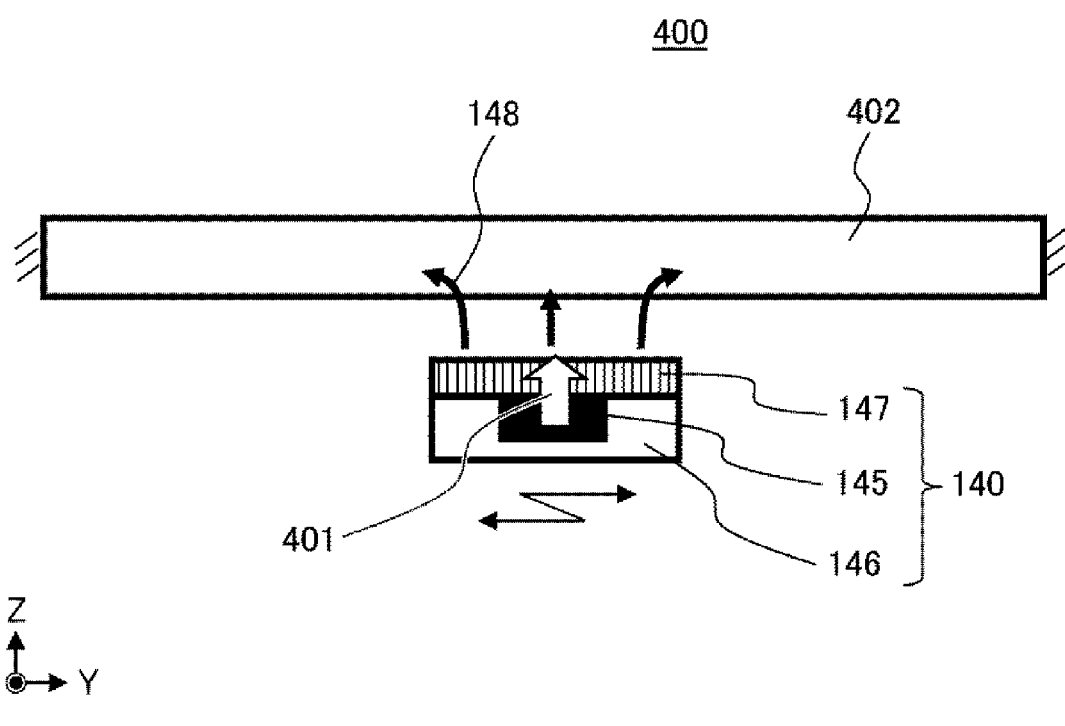

[FIG. 5]
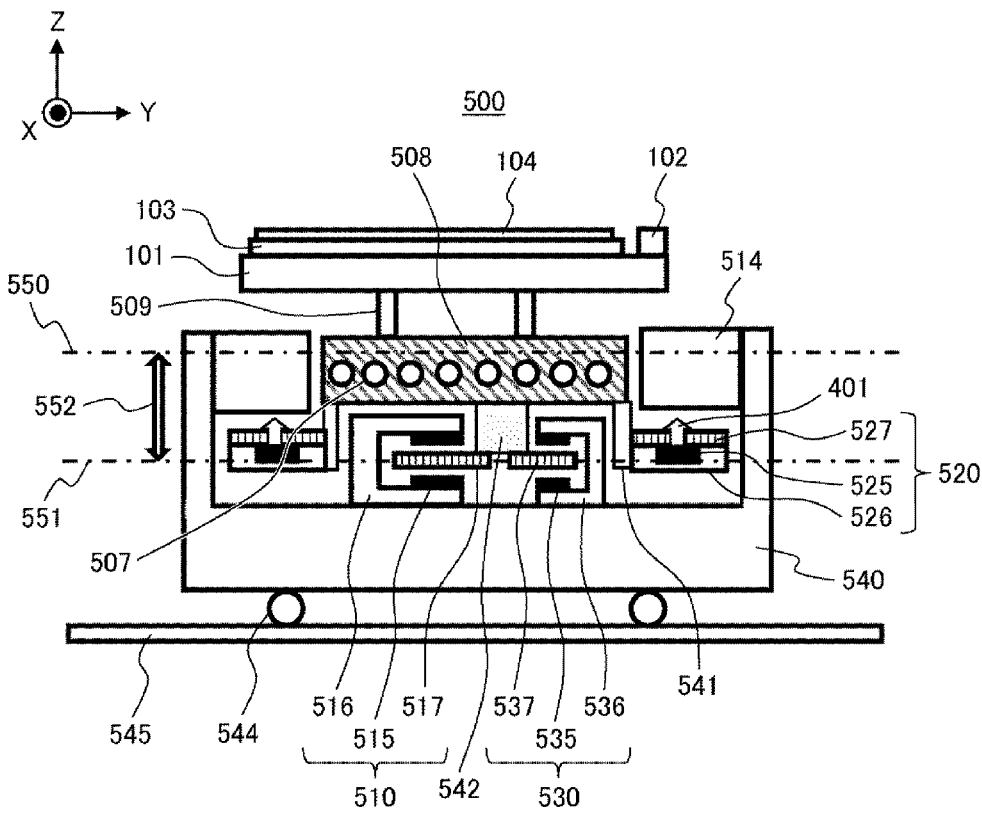
[FIG. 6]
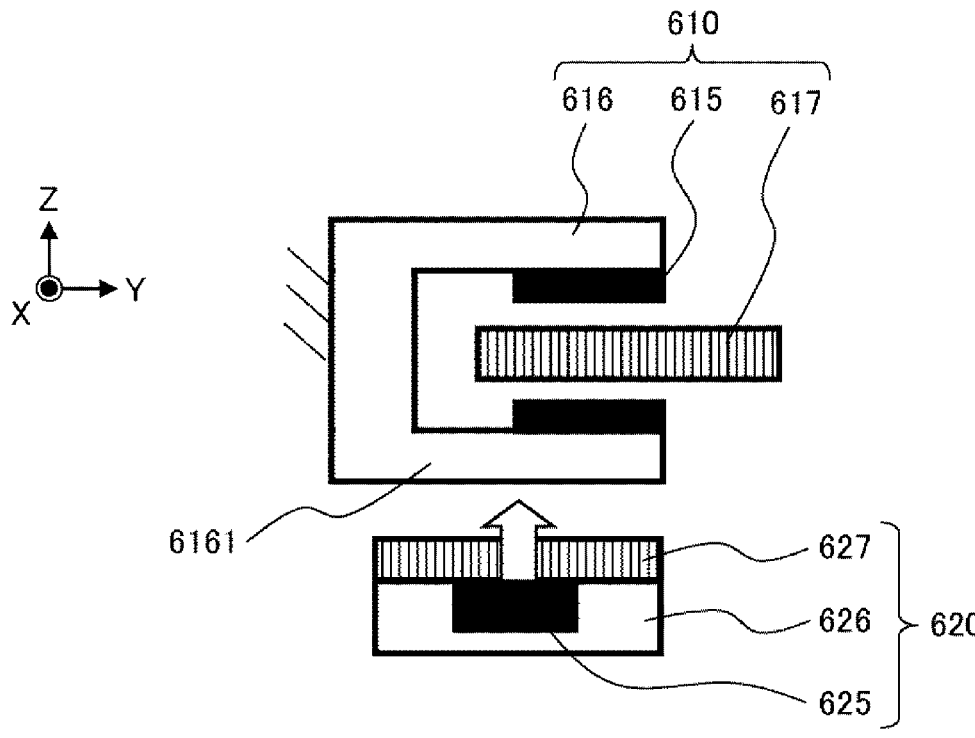

[FIG. 7]

[FIG. 8]
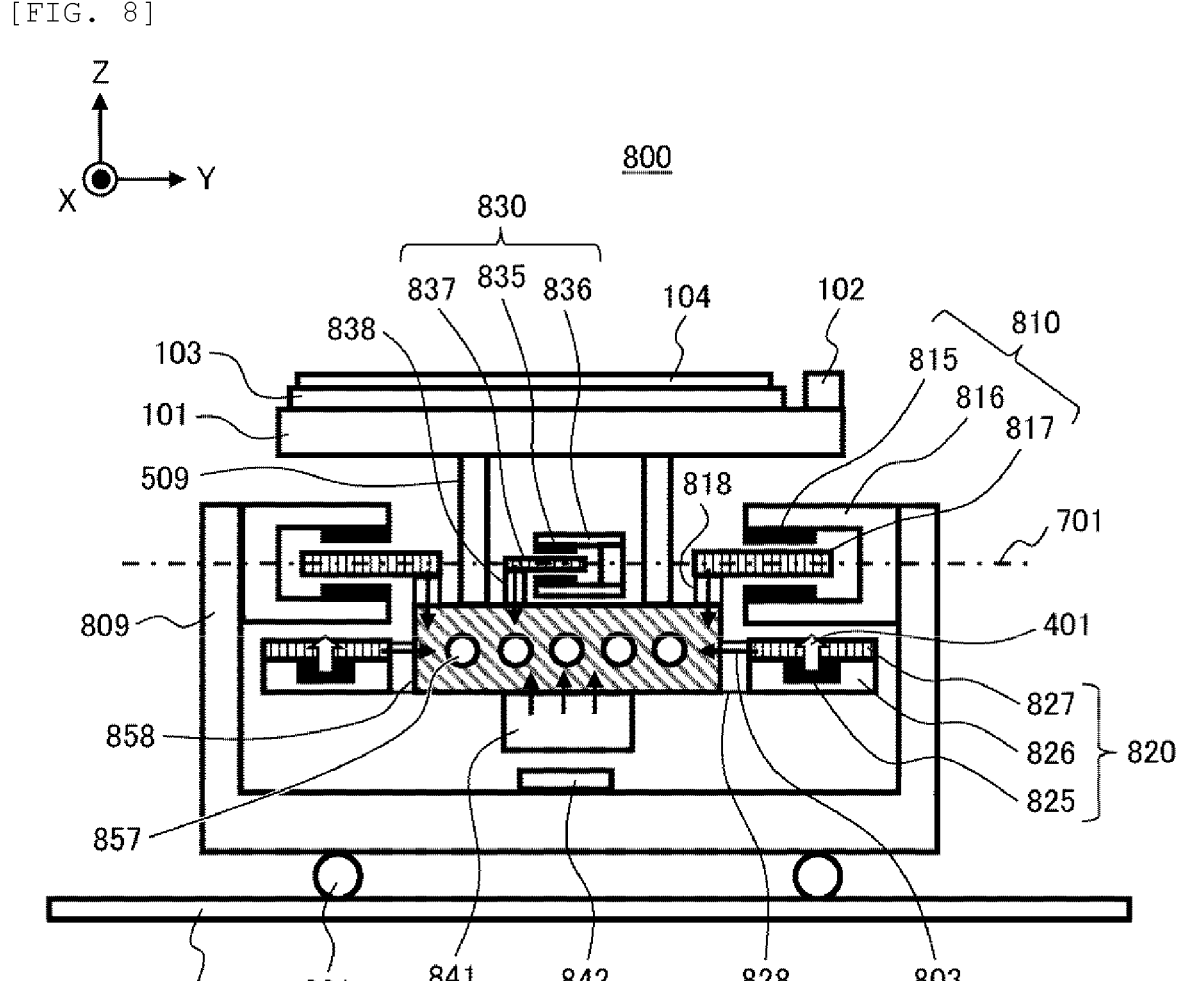

[FIG. 9]
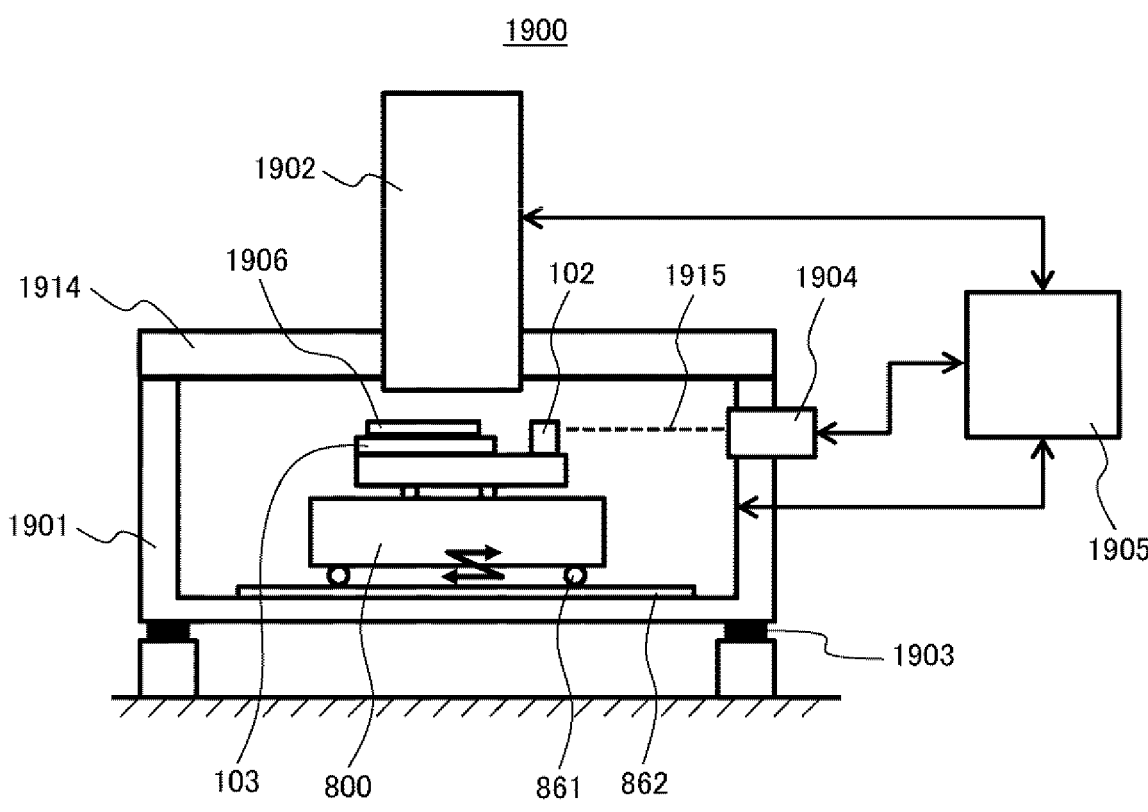
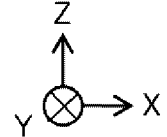

STAGE DEVICE, CHARGED PARTICLE BEAM DEVICE, AND VACUUM DEVICE

TECHNICAL FIELD

The present disclosure relates to a stage device, a charged particle beam device, and a vacuum device.

BACKGROUND ART

A technique related to a device stage for a semiconductor-related device and a magnetic levitation stage for accurately positioning and supporting a wafer in the related art has been known. PTL 1 discloses a magnetic levitation stage mechanism for moving a device. The magnetic levitation plane stage mechanism has a structure in which a magnetic material is disposed on a levitated movable table side, and gravity support is performed by an electromagnetic actuator on a fixed side. In this patent, gravity of a levitation portion is supported by upward thrust generated by a current of a coil.

CITATION LIST

Patent Literature

PTL 1: JP2020-186815A

SUMMARY OF INVENTION

Technical Problem

For example, in processes such as manufacturing, measurement, and inspection of a semiconductor wafer, the stage device in the related art is used to accurately position the semiconductor wafer. In such a stage device, it is required to improve accuracy of positioning the semiconductor wafer. However, in the stage device in the related art, an amount of heat generated in the coil becomes enormous, causing the coil to burn out. There is a problem that it is difficult to achieve a long stroke since an attraction force fluctuates at a joint portion of coils. In addition, there is a problem of magnetic field leakage, and application to a charged particle beam device is difficult.

The present disclosure solves the above problems in the related art, and provides a stage device, a charged particle beam device, and a vacuum device in which magnetic field leakage is reduced and positioning can be performed at high speed.

Solution to Problem

In order to solve the above problem, according to the invention, there is provided a stage device including a stage; a Z-axis motor configured to magnetically levitate the stage; and an X-axis motor configured to drive, in one axial direction within a plane, the stage levitated by the Z-axis motor, in which the X-axis motor includes an X-axis coil, a pair of X-axis magnets that face each other and that sandwich the X-axis coil in a vertical direction without contacting the X-axis coil, and an X-axis yoke that holds the pair of X-axis magnets, the Z-axis motor includes a Z-axis coil, a Z-axis magnet, and a Z-axis yoke that holds the Z-axis magnet, and the Z-axis motor is disposed below the X-axis motor at a position where a magnetic field that leaks from the Z-axis motor is shielded by the X-axis yoke.

In order to solve the above problem, according to the invention, there is provided a charged particle beam device including a stage device including a table configured to allow a sample to be placed thereon; a vacuum chamber accommodating the stage device and configured to evacuate an inside thereof; a charged particle beam optical system unit configured to irradiate the sample placed on the table of the stage device with a charged particle beam; and a control unit configured to control a stage means, the vacuum chamber, and the charged particle beam optical system unit, in which the stage device includes a stage on which the table is mounted, a Z-axis motor configured to magnetically levitate the stage, and an X-axis motor configured to drive, in one axial direction within a plane, the stage levitated by the Z-axis motor, the X-axis motor includes an X-axis coil, a pair of X-axis magnets that face each other and that sandwich the X-axis coil in a vertical direction without contacting the X-axis coil, and an X-axis yoke that holds the pair of X-axis magnets, the Z-axis motor includes a Z-axis coil, a Z-axis magnet, and a Z-axis yoke that holds the Z-axis magnet, and the Z-axis motor is disposed below the X-axis motor at a position where a magnetic field that leaks from the Z-axis motor is shielded by the X-axis yoke.

Further, in order to solve the above problem, according to the invention, there is provided a vacuum device including a stage device; and a vacuum chamber accommodating the stage device and configured to evacuate an inside thereof, in which the stage device includes a stage, a Z-axis motor configured to magnetically levitate the stage, and an X-axis motor configured to drive, in one axial direction within a plane, the stage levitated by the Z-axis motor, the X-axis motor includes an X-axis coil, a pair of X-axis magnets that face each other and that sandwich the X-axis coil in a vertical direction without contacting the X-axis coil, and an X-axis yoke that holds the pair of X-axis magnets, the Z-axis motor includes a Z-axis coil, a Z-axis magnet, and a Z-axis yoke that holds the Z-axis magnet, and the Z-axis motor is disposed below the X-axis motor at a position where a magnetic field that leaks from the Z-axis motor is shielded by the X-axis yoke.

Advantageous Effects of Invention

According to the above aspect of the present disclosure, it is possible to provide the stage device, the charged particle beam device, and the vacuum device in which magnetic field leakage is reduced and positioning is performed at high speed.

BRIEF DESCRIPTION OF DRAWINGS

FIG. 1 is a front view showing a schematic configuration of a motor in which a magnetic circuit is open.

FIG. 2 is a front view showing a schematic configuration of a motor in which a magnetic circuit is closed.

FIG. 3 is a front view showing a schematic configuration of a repulsion type gravity compensation actuator.

FIG. 4 is a front view showing a schematic configuration of an attraction type gravity compensation actuator.

FIG. 5 is a front view showing a schematic configuration of a magnetic levitation stage showing a reference example of the invention.

FIG. 6 is a front view illustrating a principle of the invention and showing a schematic configuration in which an X-axis motor and a Z-axis motor having Z drive and a gravity compensation function are disposed in an overlapping manner.

FIG. 7 is a front view illustrating the principle of the invention and showing a layout of a water cooling jacket, the X-axis motor, and the Z-axis motor.

FIG. 8 is a front view showing a schematic configuration of a stage device according to Embodiment 1 of the invention.

FIG. 9 is a front view showing a schematic configuration of a charged particle beam device according to Embodiment 2 of the invention.

DESCRIPTION OF EMBODIMENTS

Hereinafter, a principle of a stage device configuration according to the present disclosure and embodiments of a stage device, a charged particle beam device, and a vacuum device to which the principle is applied will be described with reference to the drawings.

For a magnetic levitation stage having a stroke with several hundred millimeters in one axial direction (X direction), an example of a motor in a longitudinal axis direction (X-axis motor axis) that is a component of the magnetic levitation stage will be described. For an X-axis motor, it is necessary to use a three-phase AC linear motor since it is necessary to secure thrust over a long stroke with several hundred millimeters. The linear motors are roughly divided into two types based on a shape of a magnetic circuit of a yoke.

FIG. 1 is an example of a linear motor 100 including yokes in which a magnetic circuit is open. A coil 107 is disposed between two permanent magnets 105, and a current passes through the coil 107 to obtain thrust. Magnetic fluxes 108 are absorbed by yokes 106 on back sides of the permanent magnets 105, but since the yokes 106 are separated from each other, the magnetic fluxes 108 pass through a space and enter back sides of the yokes 106 on opposite sides. Such a linear motor 100 in which the magnetic circuit of the yokes 106 is open has an advantage that a structure is simple, but has a problem of large magnetic field leakage from the yokes 106.

FIG. 2 is an example of a linear motor 110 including a U-shaped yoke in which a magnetic circuit is closed. In the linear motor 110 having such a closed magnetic circuit, a U-shaped yoke 116 is used. In such a configuration, a magnetic flux 118 entering the U-shaped yoke 116 from one of a pair of permanent magnets 115 disposed facing each other enters the corresponding permanent magnet 115 through the U-shaped yoke 116 with almost no leakage to an outside. Accordingly, leakage magnetic field generated due to leakage of the magnetic flux 118 is small. In the invention, this principle is applied.

From a viewpoint of reducing magnetic field leakage, it is effective to use a linear motor that adopts the U-shaped yoke 116 in which the magnetic circuit is closed as an X motor.

Next, a Z-axis motor that performs gravity compensation and generates thrust in a Z-axis direction for a levitation portion will be described. When gravity of the levitation portion is supported only by thrust obtained by a current of a coil, it is necessary to cause a relatively large current to flow through the coil, and an amount of heat generated in the coil becomes enormous. Therefore, it is effective to use a magnetic repulsion force or a magnetic attraction force in the Z-axis motor from a viewpoint of reducing coil heat generation during the gravity compensation.

FIG. 3 shows an example of a gravity compensation actuator 300 using a repulsion force. A structure is shown in which permanent magnets 301 spread over a yoke 302 on a fixed side, and gravity of a levitation portion is supported by a repulsion force 313 between the permanent magnet 301 and a permanent magnet 125 attached to a yoke 126 on a movable side. By adjusting a current amount of the coil 127, it is also possible to increase or decrease the repulsion force and to perform driving in a vertical direction (Z direction), so that an interval between the permanent magnet 301 on the fixed side and the permanent magnet 125 on the movable side can be adjusted. In this structure, if gravity compensation is implemented over a movable stroke 312 with several hundred millimeters in a plane (X direction or Y direction), it is necessary to form a long magnet corresponding to the movable stroke for the permanent magnet 301 on the fixed side. However, since it is actually difficult to make a magnet having a length as described above, a plurality of permanent magnets are spread to form the permanent magnet on the fixed side having a required length. However, when a plurality of permanent magnets are combined, a density of a magnetic flux 128 decreases at a joint of the permanent magnets, and the repulsion force changes. Therefore, in a case of a configuration in which a magnetic repulsion force is used as shown in FIG. 3, a variation of a gravity compensation force occurs during movement of a stage, causing yawing, which is not suitable for long strokes.

FIG. 4 is an example of a gravity compensation actuator 400 using an attraction force. A permanent magnet 145 of a linear motor 140, which includes the permanent magnet 145, a yoke 146, and a coil 147, is attracted to a guide yoke 402 made of a magnetic material such as an iron-based material on the fixed side, and a magnetic attraction force 401 is used for gravity compensation. Since the guide yoke 402 is made of an iron-based material, a length of the guide yoke 402 can be freely set in accordance with a movable range of the linear motor 140. By adjusting a current amount of the coil 147, it is also possible to increase or decrease an attraction force between the guide yoke 402 and the permanent magnet 145 to perform driving in the vertical direction (Z direction), and to adjust an interval between the guide yoke 402 and the linear motor 140. The magnetic attraction force 401 is suitable for a long stroke because the force is constant in a stroke where the guide yoke 402 exists.

That is, in order to implement a magnetic levitation stage with a low magnetic field, it is effective to use a U-shaped yoke for the X motor and an attraction type for a Z motor.

FIG. 5 shows a magnetic levitation stage 500 as a reference example of the invention. The reference example shown in FIG. 5 is an example of a configuration of the magnetic levitation stage 500 implemented by using a U-shaped yoke 516 as shown in FIG. 2 for an X-axis motor 510 and an attraction type as shown in FIG. 4 for a Z-axis motor 520 according to the above concept. In the configuration shown in FIG. 5, 101 denotes a top table, 102 denotes a bar mirror, 103 denotes a sample stage, and 104 denotes a sample placed on the sample stage 103. 508 denotes a water cooling jacket that also serves as an X stage, and water cooling pipes 507 pass through an inside thereof. Top table support columns 509 are fixed to the water cooling jacket 508. The top table 101 is supported by the top table support columns 509.

520 denotes a Z-axis motor, which includes a coil 527, a permanent magnet 525, and a yoke 526. A pair of Z-axis motors 520 are disposed on left and right sides of the water cooling jacket 508. Each of the pair of Z-axis motors 520 is fixed, by a side bracket 541, to the water cooling jacket 508 that also serves as the X stage.

510 denotes the X-axis motor, which includes a coil 517, a permanent magnet 515, and the yoke 516. The coil 517 is fixed, by a central bracket 542, to the water cooling jacket 508 that also serves as the X stage. The yoke 516 is fixed to a Y table 540.

530 denotes a Y-axis motor, which includes a coil 537, a permanent magnet 535, and a yoke 536. The coil 537 is fixed, by the central bracket 542, to the water cooling jacket 508 that also serves as the X stage. The yoke 536 is fixed to the Y table 540.

A pair of yokes 514 are fixed to the Y table 540 at positions facing the pair of Z-axis motors 520. The Y table 540 is guided by a lower axis linear guide 545 via spherical bodies 544.

The magnetic levitation stage 500 shown in FIG. 5 is a stack type stage configuration in which an X-axis stage including the water cooling jacket 508 is placed on a Y-axis stage including the Y table 540. Y axis (lower axis) is guided by a contact type rolling guide, and the X axis (upper axis) is made non-contact by a magnetic levitation guide. That is, the upper axis is the magnetic levitation stage having a stroke with several hundred millimeters in an X-axis direction.

In this configuration, since the coil 537 of the Y-axis motor 530 and the coil 517 of the X-axis motor 510 are on a levitation side, it is necessary to mount the water cooling jacket 508 containing the water cooling pipes 507 for cooling the coils. It is necessary to dispose the Z-axis motors 520 at a wide interval on both sides in order to control an inclination of the levitation portion. It is necessary to dispose the Z-axis motor 520 at a low position away from the top table 101 in order to reduce magnetic field leakage to a top table 101 side. Therefore, the X-axis motor 510 (and the Y-axis motor 530) is inevitably disposed at a low position, and a gap 552 between a horizontal axis drive center 551 and a height 550 of a center of gravity is large. Since a pitching moment (a rotational force around the Y axis) when driving the stage increases in proportion to the gap 552, there is a problem that a current required for the coil 527 of the Z-axis motor 520 increases, coil heat generation during driving increases, and a throughput decreases.

The invention solves the above problems, and by preventing occurrence of the pitching moment (the rotational force around the Y-axis) when driving the stage, it is possible to eliminate a need to increase a current required for the coil of the Z-axis motor and to reduce the coil heat generation during driving.

Hereinafter, embodiments of the invention will be described in detail with reference to the drawings. Throughout the drawings for showing the present embodiment, components having the same functions are denoted by the same reference signs, and the repeated description thereof is omitted in principle.

The invention is not to be construed as being limited to the description of the embodiments described below. It will be easily understood by those skilled in the art that the specific configuration can be changed without departing from the spirit or scope of the invention.

Embodiment 1

A gravity compensation mechanism with a low magnetic field according to a first embodiment of the invention will be described with reference to FIG. 6. FIG. 6 shows a configuration in which a Z-axis motor 620 is disposed below an X-axis motor 610. As shown in FIG. 6, a permanent magnet 625, a yoke 626 and a coil 627 of the Z-axis motor 620 are disposed below a U-shaped yoke 616 of the X-axis motor 610. By energizing the coil 627, an attraction force 601 acts on the Z-axis motor 620 to form the Z-axis motor 620 that also serves as an attraction type gravity compensation actuator.

With such a configuration, a surface 6161 of the yoke 616 of the X-axis motor 610 facing the Z-axis motor also plays a role corresponding to the guide yoke 402 described with reference to FIG. 4, and the yoke 514 in the magnetic levitation stage 500 as shown in FIG. 5 is not required.

By disposing the X-axis motor 610 and the Z-axis motor 620 as shown in FIG. 6, magnetic field leakage from the permanent magnet 625 and the yoke 626 of the Z-axis motor 620 can be shielded by using the yoke 616 of the X-axis motor 610, and an influence of an electron optical system (not shown) disposed above the X-axis motor 610 on an electron beam can be reduced.

Figure 7:
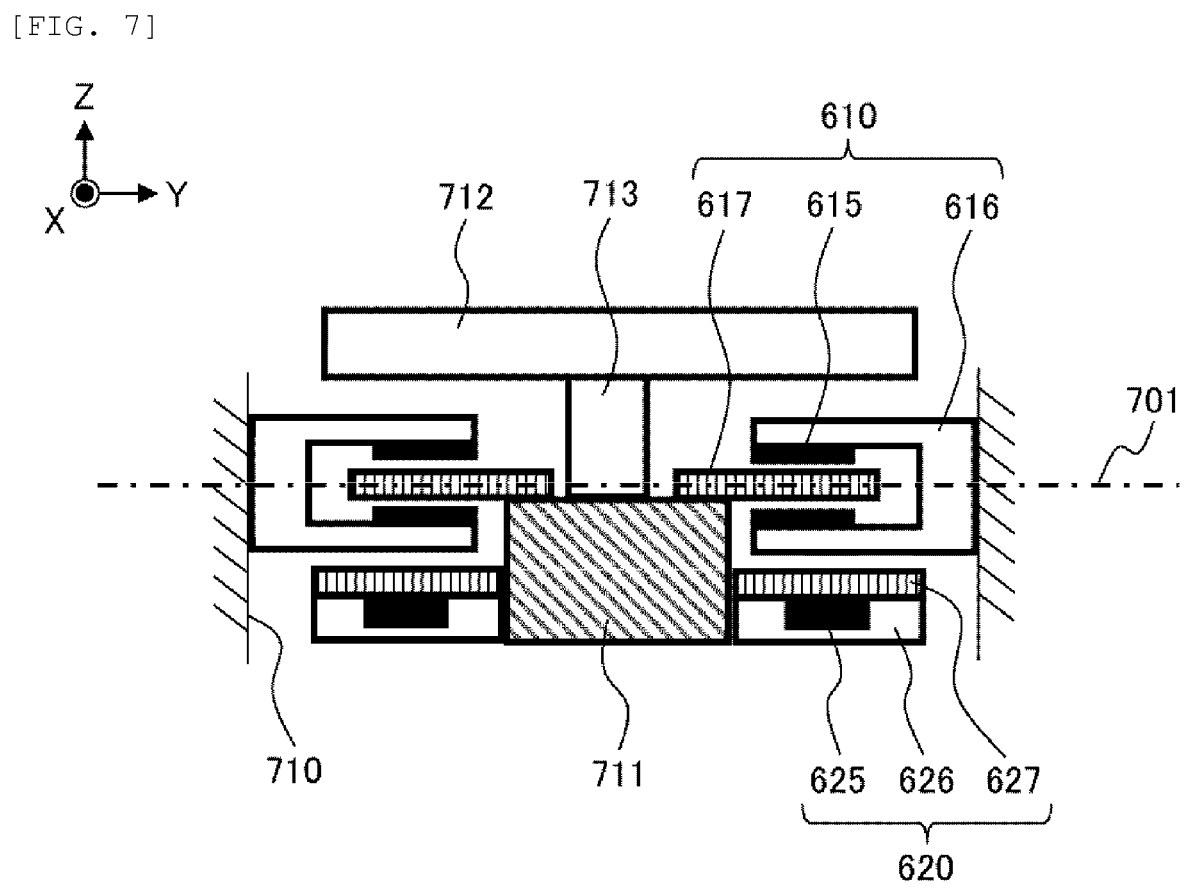

FIG. 7 shows the principle of the present embodiment. A configuration shown in FIG. 7 shows a state where the X-axis motor 610 and the Z-axis motor 620 shown in FIG. 6 are attached to a block 711 corresponding to the water cooling jacket 508 in the magnetic levitation stage 500 in FIG. 5. A table 712 corresponding to the top table 101 in the magnetic levitation stage 500 in FIG. 5 is supported by a support column 713 on the block 711.

In the configuration shown in FIG. 7, a pair of X-axis motors 610 are disposed on left and right sides of the block 711, a pair of Z-axis motors 620 are disposed on the left and right sides of the block 711, and the yoke 616 of the X-axis motor 610 is fixed to a wall surface 710. The coil 617 of the X-axis motor 610 and the yoke 626 and the coil 627 of the Z-axis motor 620 are fixed to the block 711.

With this configuration, by energizing the pair of left and right coils 627, the attraction force 601 acts on the yoke 616 of the X-axis motor 610 fixed to the wall surface 710 and the Z-axis motor 620 acting as the attraction type gravity compensation actuator, so that the Z-axis motor 620 levitates integrally with the block 711 and the table 712. By controlling a current flowing through the coil 617 of the X-axis motor 610 in this state, the block 711, the table 712, and the Z-axis motor 620 move in the X direction on a horizontal axis drive center 701 in a levitated state.

In such a configuration, by balancing masses of the table 712 and the block 711 and the pair of right and left Z-axis motors 620 above and below the horizontal axis drive center 701, positions of centers of gravity of the table 712 and the block 711 and the pair of right and left Z-axis motors 620 can be overlapped on the horizontal axis drive center 701. Accordingly, the center of gravity can be driven during horizontal axis driving, and occurrence of the pitching moment as a problem in the reference example shown in FIG. 5 can be prevented.

By adopting a configuration that prevents occurrence of pitching when the levitated block 711 and the table 712 move, the occurrence of pitching can be prevented even when a current flowing through the coil 627 of the Z-axis motor 620 is reduced, and heat generation of the Z-axis motor 620 can be reduced.

In the present embodiment, as shown in the principle in FIG. 7, the invention relates to a stage device including a support stage for supporting a target to be positioned and a levitation mechanism that magnetically levitates the support stage for positioning, and a gravity compensation mechanism and a Z actuator are implemented by disposing a permanent magnet and a coil below an X yoke of an X motor in the levitation mechanism.

FIG. 8 shows a schematic configuration of a magnetic levitation stage 800 with a low magnetic field that is implemented by the present embodiment described with reference to principles in FIGS. 6 and 7. The magnetic levitation stage 800 shown in FIG. 8 includes a water cooling jacket 858 corresponding to the block 711 shown in FIG. 7, X-axis motors 810 each corresponding to the X-axis motor 610, Z-axis motors 820 each corresponding to the Z-axis motor 620 in FIG. 7, and further, a Y-axis motor 830.

A yoke 816 of the X-axis motor 810 is fixed to a Y table 809, and a coil 817 of the X-axis motor 810 is fixed to the water cooling jacket 858 via a block 818. A yoke 826 of the Z-axis motor 820 is fixed to the water cooling jacket 858 via a block 828. Further, a yoke 836 of the Y-axis motor 830 is fixed to the Y table 809, and a coil 837 is fixed to the water cooling jacket 858 via a block 838. The Y table 809 is guided by a lower axis linear guide via spherical bodies 861.

Heat flows 803 from coils 817, 827, and 837 of the respective motors serving as heat generation sources are shown by arrows. The coil 817 of the X-axis motor 810 is directly fixed to the water cooling jacket 508 with the block 818, and the coil 827 of the Z-axis motor 820 is directly fixed to the water cooling jacket 508 with the block 828. Therefore, paths of the heat flows from the coil 817 and the coil 827 to the water cooling jacket 858 are shortened, enabling efficient coil cooling.

On the magnetic levitation stage 800, a linear scale including a scale head 841 fixed to the water cooling jacket 858 side and a scale plate 842 fixed to a Y table 809 side are mounted, and a position of the water cooling jacket 858, which is the levitation portion facing the Y table 809, is measured. A configuration shown in FIG. 8 shows an example in which a one-axis linear scale is mounted, but it is necessary to mount a six-axis linear scale for stable levitation control.

A relative displacement between the scale head 841 and the scale plate 842 is measured and used for positioning feedback control on the water cooling jacket 858, which is the levitation portion. Since the scale head 841 is a heat generation source similarly to the coils 817, 827, and 837 of the respective motors, it is necessary to cool the scale head 841 to prevent heat from being transmitted to the top table. In the configuration shown in FIG. 8, since the scale head 841 is directly fixed to the water cooling jacket 858, cooling efficiency is high. By fixing the top table 101 on which the sample stage 103 is mounted to the water cooling jacket 858 via the top table support columns 509, heat generation of the coils 817, 827 and 837 of the respective motors and the scale head 841 can be prevented from being transmitted to the sample 104 mounted on the sample stage 103.

As described above, in the present embodiment, in the magnetic levitation stage, the magnets and the coils are disposed below the two U-shaped X yokes, and an X yoke opening are disposed toward an inside, and the coils are fixed to the water cooling jacket.

In the configuration of the magnetic levitation stage 800 shown in FIG. 8, a position of a center of gravity of a portion including the water cooling jacket 858 and the top table 101 which levitate by operating the Z-axis motor 820 is adjusted so as to overlap the horizontal axis drive center 701 as described with reference to FIG. 7. Accordingly, during horizontal axis drive to move a movable portion including the water cooling jacket 858 and the top table 101 by driving the X-axis motor, the center of gravity can be driven to overlap the horizontal axis drive center 701, and occurrence of a pitching moment can be prevented.

Embodiment 2

Next, as a second embodiment, FIG. 9 shows an example in which the magnetic levitation stage 800 described in Embodiment 1 is applied to a charged particle beam device and a vacuum device. A semiconductor measurement device 1900, which is an embodiment of the charged particle beam device and the vacuum device according to the present embodiment shown in FIG. 9, includes a stage device 1910 that positions a target, and a vacuum chamber 1901 that accommodates the stage device 1910. The semiconductor measurement device 1900 according to the present embodiment is, for example, a length measurement SEM as an application device of a scanning electron microscope (SEM). The stage device 1910 has the same configuration as the magnetic levitation stage 800 described with reference to FIG. 8 in Embodiment 1.

The semiconductor measurement device 1900 includes, for example, the stage device 1910, the vacuum chamber 1901, an electron optical system lens barrel 1902, vibration damping mounts 1903, a laser interferometer 1904, and a controller 1905. The vacuum chamber 1901 accommodates the stage device 1910, is depressurized inside by a vacuum pump (not shown), and becomes a vacuum state having a pressure lower than an atmospheric pressure. In order to prevent the stage device 1910 and the electron optical system lens barrel 1902 from being affected by external vibrations, the vacuum chamber 1901 is supported by the vibration damping mounts 1903.

The semiconductor measurement device 1900 positions a target 1906 such as a semiconductor wafer using the stage device 1910, irradiates the target with an electron beam from the electron optical system lens barrel 1902, images a pattern on the target, and measures a line width of the pattern to evaluate shape accuracy. In the stage device 1910, a position (the position in the Y direction) of the bar mirror 102 is measured by the laser interferometer 1904, a position (the position in the X direction) of the scale plate 842 is measured by the scale head 841 shown in FIG. 8, and positioning of the target such as a semiconductor wafer held on the sample stage 103 of the stage device 1910 in the X and Y directions is controlled by the controller 1905.

In a configuration of such a semiconductor measurement device 1900, when the configuration of the magnetic levitation stage 800 described with reference to FIG. 8 in Embodiment 1 is adopted as the stage device 1910, while the electron beam is emitted onto the target 1906 from the electron optical system lens barrel 1902, the top table 101 is stopped and only a small current flows in the coil 807 of the X-axis motor 810 and the coil 837 of the Y-axis motor 830. On the other hand, a relatively large current flows through the coil 827 during an operation of the Z-axis motor 820. In this state, a magnetic field generated on the top table 101 side among magnetic fields generated by the coil 827 of the Z-axis motor 820 is trapped by the yoke 816 of the X-axis motor 810, and a magnetic field leaking to the top table 101 side is reduced, and an influence on the electron beam emitted onto the target 1906 from the electron optical system lens barrel 1902 can be reduced to a negligible extent.

As described above, according to the present embodiment, by adopting the configuration of the magnetic levitation stage 800 described with reference to FIG. 8 in Embodiment 1 as the stage device 1910 of the semiconductor measurement device 1900, it is possible to prevent occurrence of contamination on a surface of the target 1906 caused by metal powder generated from a sliding portion when the stage using a sliding type guide in the related art is adopted.

When adopting a stage using a sliding type guide mechanism in the related art, there is a possibility that a position of the target 1906 placed on the sample stage 103 changes due to thermal expansion of the stage as a heat generation source by the sliding portion, and a position of the electron beam emitted onto the target from the electron optical system lens barrel 1902 may be shifted. Meanwhile, in the semiconductor measurement device 1900 according to the present embodiment, since the configuration of the magnetic levitation stage 800 is adopted, heat generation due to sliding can be eliminated, and a problem of electron beam irradiation position shift due to thermal expansion can be eliminated.

Further, by adopting the configuration of the magnetic levitation stage 800, it is possible to implement positioning at high speed and high accuracy in a non-contact manner, and for example, it is possible to perform positioning with accuracy of about ±1 μm in about 1/100 of a time as compared with a case of using the sliding type guide mechanism in the related art.

Further, by adopting the configuration of the magnetic levitation stage 800, a vibration, deformation, and heat of a lower table are not transmitted to an upper table that is magnetically levitated, and a cause of lowering irradiation position accuracy of the electron beam on the target can be eliminated.

That is, the semiconductor measurement device 1900 according to the present embodiment includes the magnetic levitation stage 800 as the stage device 1910, it is possible to improve positioning accuracy of a target such as a wafer and to prevent leakage of a magnetic field. Therefore, it is possible to improve measurement accuracy of the semiconductor measurement device as the charged particle beam device. Since the levitation mechanism of the magnetic levitation stage 800 is of a magnetic levitation type, the magnetic levitation stage 800 can be easily applied to a semiconductor measurement device that is a vacuum device, and can exhibit excellent effects such as reduction of contamination and reduction of heat generation. The charged particle beam device and the vacuum device in the present disclosure are not limited to the semiconductor measurement device.

Although the embodiments of the invention have been described in detail with reference to the drawings, specific configurations are not limited to the embodiments, and if design changes and the like may be made without departing from the gist of the invention, the changes are included in the invention.

REFERENCE SIGNS LIST

100, 110, 120, and 140: linear motor
101: top table
102: bar mirror
103: sample stage
104: sample
105, 115, 125, 145: permanent magnet
106, 116, 126, 146: yoke
107, 117, 127, 147: coil
108, 118, 128, 148: magnetic flux
300, 400: gravity compensation actuator
301: permanent magnet
402: guide yoke
403: back yoke
500, 800: magnetic levitation stage
510, 610, 810: X-axis motor
515, 615, 815: permanent magnet of X-axis motor
516, 616, 816: yoke of X-axis motor
517, 617, 817: coil of X-axis motor
520, 620, 820: Z-axis motor

525, 625, 825: permanent magnet of Z-axis motor
526, 626, 826: yoke of Z-axis motor
527, 627, 827: coil of Z-axis motor
530, 830: Y-axis motor
535, 835: permanent magnet of Y-axis motor
536, 836: yoke of Y-axis motor
537, 837: coil of Y-axis motor
540: Y table
841: scale head
842: scale plate
858: water cooling jacket
1900: semiconductor measurement device
1901: vacuum chamber
1902: electron optical system lens barrel
1905: controller

The invention claimed is:

1. A stage device comprising:
a stage;
a Z-axis motor configured to magnetically levitate the stage; and
an X-axis motor configured to drive, in one axial direction within a plane, the stage levitated by the Z-axis motor, wherein
the X-axis motor includes an X-axis coil, a pair of X-axis magnets that face each other and that sandwich the X-axis coil in a vertical direction without contacting the X-axis coil, and an X-axis yoke that holds the pair of X-axis magnets,
the Z-axis motor includes a Z-axis coil, a Z-axis magnet, and a Z-axis yoke that holds the Z-axis magnet, and
the Z-axis motor is disposed below the X-axis motor at a position where a magnetic field that leaks from the Z-axis motor is shielded by the X-axis yoke.

2. The stage device according to claim 1, wherein
the X-axis yoke has a U-shaped cross section that covers outer sides of the pair of X-axis magnets sandwiching the X-axis coil in the vertical direction and that has an open surface facing the stage, and the Z-axis motor is disposed below the X-axis yoke.

3. The stage device according to claim 2, further comprising:
a casing portion having a wall surface disposed outside the stage, wherein
the X-axis coil of the X-axis motor and the Z-axis motor are supported by the stage, and the X-axis yoke is fixed to the wall surface of the casing portion which is disposed outside the stage.

4. The stage device according to claim 3, wherein
a portion of the X-axis yoke facing the Z-axis motor levitates the Z-axis motor and the stage by magnetically attracting the Z-axis motor by a magnetic field generated by the Z-axis motor.

5. The stage device according to claim 1, wherein
a height of a drive center at which the stage is driven in the one axial direction by the X-axis motor is the same as a height of a center of gravity of a portion including the stage that is levitated by the Z-axis motor.

6. The stage device according to claim 1, wherein
the stage includes a table configured to allow a sample to be mounted thereon, and a water cooling jacket including a cooling water pipe therein.

7. A charged particle beam device comprising:
a stage device including a table configured to allow a sample to be placed thereon;
a vacuum chamber accommodating the stage device and configured to evacuate an inside thereof;

11 a charged particle beam optical system unit configured to irradiate the sample placed on the table of the stage device with a charged particle beam; and a control unit configured to control the stage device, the vacuum chamber, and the charged particle beam optical system unit, wherein the stage device includes a stage on which the table is mounted, a Z-axis motor configured to magnetically levitate the stage, and an X-axis motor configured to drive, in one axial direction within a plane, the stage levitated by the Z-axis motor, the X-axis motor includes an X-axis coil, a pair of X-axis magnets that face each other and that sandwich the X-axis coil in a vertical direction without contacting the X-axis coil, and an X-axis yoke that holds the pair of X-axis magnets, the Z-axis motor includes a Z-axis coil, a Z-axis magnet, and a Z-axis yoke that holds the Z-axis magnet, and the Z-axis motor is disposed below the X-axis motor at a position where a magnetic field that leaks from the Z-axis motor is shielded by the X-axis yoke.

8. The charged particle beam device according to claim 7, wherein the X-axis yoke of the stage device has a U-shaped cross section that covers outer sides of the pair of X-axis magnets sandwiching the X-axis coil in the vertical direction and that has an open surface facing the stage, and the Z-axis motor is disposed below the X-axis yoke.

9. The charged particle beam device according to claim 8, wherein the stage device further includes a casing portion having a wall surface disposed outside the stage, and the X-axis coil of the X-axis motor and the Z-axis motor are supported by the stage, and the X-axis yoke is fixed to the wall surface of the casing portion which is disposed outside the stage.

10. The charged particle beam device according to claim 9, wherein a portion of the X-axis yoke of the stage device facing the Z-axis motor levitates the Z-axis motor and the stage by magnetically attracting the Z-axis motor by a magnetic field generated by the Z-axis motor.

11. The charged particle beam device according to claim 7, wherein the stage device includes a Y-axis motor configured to drive the stage device in a direction perpendicular to the one axial direction, a one axial direction position measuring unit configured to measure a position of the stage in the one axial direction in a non-contact manner, and a right angle direction position measuring unit configured to measure a position in the direction perpendicular to the one axial direction in a non-contact manner, and the control unit controls the X-axis motor and the Y-axis motor based on position information on the stage measured by the one axial direction position measuring unit and the right angle direction position measuring unit.

12. A vacuum device comprising:

a stage device; and a vacuum chamber accommodating the stage device and configured to evacuate an inside thereof, wherein the stage device includes a stage, a Z-axis motor configured to magnetically levitate the stage, and an X-axis motor configured to drive, in one axial direction within a plane, the stage levitated by the Z-axis motor, the X-axis motor includes an X-axis coil, a pair of X-axis magnets that face each other and that sandwich the X-axis coil in a vertical direction without contacting the X-axis coil, and an X-axis yoke that holds the pair of X-axis magnets, the Z-axis motor includes a Z-axis coil, a Z-axis magnet, and a Z-axis yoke that holds the Z-axis magnet, and the Z-axis motor is disposed below the X-axis motor at a position where a magnetic field that leaks from the Z-axis motor is shielded by the X-axis yoke.

13. The vacuum device according to claim 12, wherein the stage device includes a Y-axis motor configured to drive the stage device in a direction perpendicular to the one axial direction, a one axial direction position measuring unit configured to measure a position of the stage in the one axial direction in a non-contact manner, and a right angle direction position measuring unit configured to measure a position in the direction perpendicular to the one axial direction in a non-contact manner.

* * * * *